US009877580B2

(12) United States Patent
Stewart, Jr. et al.

(10) Patent No.: US 9,877,580 B2
(45) Date of Patent: Jan. 30, 2018

(54) SUSPENDED CEILING-MOUNTABLE ENCLOSURE

(71) Applicant: RGB SYSTEMS, INC., Anaheim, CA (US)

(72) Inventors: William C Stewart, Jr., Raleigh, NC (US); Michael Hudson, Nashville, NC (US); Dale Vipatapalin, Chino Hills, CA (US); Tuan Tran, Irvine, CA (US); Andrew C Edwards, Anaheim, CA (US)

(73) Assignee: RGB Systems, Inc., Anaheim, CA (US)

( * ) Notice: Subject to any disclaimer, the term of this patent is extended or adjusted under 35 U.S.C. 154(b) by 1184 days.

(21) Appl. No.: 13/848,075

(22) Filed: Mar. 21, 2013

(65) Prior Publication Data

US 2014/0265774 A1    Sep. 18, 2014

Related U.S. Application Data

(60) Provisional application No. 61/785,135, filed on Mar. 14, 2013.

(51) Int. Cl.
*H05K 13/00* (2006.01)
*A47B 81/00* (2006.01)
*E04B 9/00* (2006.01)
*A47B 46/00* (2006.01)
*F16M 13/02* (2006.01)
*H02G 3/20* (2006.01)

(52) U.S. Cl.
CPC .............. *A47B 81/00* (2013.01); *A47B 46/00* (2013.01); *E04B 9/003* (2013.01); *F16M 13/027* (2013.01); *H02G 3/20* (2013.01); *H05K 13/00* (2013.01); *H04R 2201/021* (2013.01); *Y10T 29/49117* (2015.01)

(58) Field of Classification Search
None
See application file for complete search history.

(56) References Cited

U.S. PATENT DOCUMENTS

| 6,062,975 | A  | 5/2000  | Knudtson |
| 7,826,215 | B2 | 11/2010 | Glover |
| 7,861,825 | B2 | 1/2011  | Stewart, Jr. et al. |
| 7,866,438 | B2 | 1/2011  | Stewart, Jr. et al. |

(Continued)

*Primary Examiner* — Courtney Smith
*Assistant Examiner* — Jessey R Ervin
(74) *Attorney, Agent, or Firm* — Knobbe, Martens, Olson & Bear LLP

(57) ABSTRACT

The present invention is a ceiling-mountable enclosure comprising a support frame, a lightweight inner enclosure, and a back box configured for installation in a suspended ceiling. The apparatus of the present invention includes a removable device door configured to be mounted to the support frame. Electrical and signal wires are routed through conduit access plates provided at the back box. Electrical or other equipment is mounted to a removable device door. The removable device door with mounted equipment is attached to the support frame, then rotated upwards to fit flush with the ceiling and fastened to the support frame. A variety of power receptacles are provided that are configured to be mounted to either the back box, the inner enclosure, or the removable device door. The enclosure includes a cooling system comprising an electrically powered fan and air ducts integrated into the inner enclosure.

13 Claims, 24 Drawing Sheets

(56) References Cited

U.S. PATENT DOCUMENTS

| | | |
|---|---|---|
| 8,091,681 B2 | 1/2012 | Stewart, Jr. et al. |
| 8,109,360 B2 | 2/2012 | Stewart, Jr. et al. |
| 8,127,885 B2 | 3/2012 | Stewart, Jr. et al. |
| 8,276,706 B2 | 10/2012 | Hudson et al. |
| 8,286,749 B2 | 10/2012 | Stewart, Jr. et al. |
| 8,297,402 B2 | 10/2012 | Stewart, Jr. et al. |
| 8,353,384 B2 | 1/2013 | Stewart, Jr. et al. |
| 8,403,107 B2 | 3/2013 | Stewart, Jr. et al. |
| 8,439,153 B2 | 5/2013 | Hudson et al. |
| 8,443,930 B2 | 5/2013 | Stewart, Jr. et al. |
| 8,479,871 B2 | 7/2013 | Stewart, Jr. et al. |
| 8,631,897 B2 | 2/2014 | Stewart, Jr. et al. |
| 8,672,087 B2 | 3/2014 | Stewart, Jr. et al. |
| 8,720,640 B2 | 5/2014 | Stewart, Jr. et al. |
| 8,893,849 B2 | 11/2014 | Hudson et al. |
| 2007/0171613 A1* | 7/2007 | McMahan .......... H05K 7/20736 361/695 |
| 2008/0180004 A1* | 7/2008 | Martich .................. H04Q 1/10 312/223.1 |
| 2009/0015731 A1* | 1/2009 | Nagami .............. B60R 11/0235 348/837 |
| 2009/0230827 A1* | 9/2009 | MacAll ................ H05K 5/0204 312/223.1 |
| 2010/0000758 A1* | 1/2010 | Bravo ...................... H02G 3/16 174/60 |
| 2010/0095604 A1* | 4/2010 | Newkirk ................ E04F 19/08 52/79.1 |
| 2010/0238670 A1 | 9/2010 | Moench |
| 2011/0019862 A1 | 1/2011 | Smith et al. |
| 2012/0045331 A1 | 2/2012 | Villella |

\* cited by examiner

SUSPENDED CEILING-MOUNTABLE ENCLOSURE

CROSS-REFERENCE TO RELATED APPLICATIONS

This patent application claims the benefit of provisional U.S. Patent Application No. 61/785,135 filed Mar. 14, 2013 which is incorporated by reference in its entirety herein.

BACKGROUND OF THE INVENTION

(1) Field of the Invention

The present invention relates to an enclosure for electrical and other equipment configured to be mounted in a suspended ceiling.

(2) Background of the Invention

Suspended ceilings consisting of ceiling tiles supported by a grid of T-bar frames are commonly used to form a finished ceiling in business as well as in some residential environments. It is often desired to mount electrical and other equipment in suspended ceilings. Various types of enclosures for electrical and other equipment have been developed for installation in suspended ceilings.

One type of prior art enclosure that may be mounted in a suspended ceiling consists of a rectangular steel box and a removable door. The steel enclosure is placed onto the suspended ceiling grid and secured to the structural ceiling with support wires. After the enclosure has been installed in the ceiling, the door is removed and equipment is installed from below through the door opening into the enclosure. After the equipment has been installed, the front door is replaced. The weight of the all steel prior art enclosure can result in installation challenges. For example, during installation, the enclosure cannot readily be laid temporarily onto the suspended ceiling framework while an installer attempts to secure support wires between a structural support and the enclosure. Instead the weight of the enclosure must be supported by the installer during installation, often while the installer is also standing on a ladder, making the installation process difficult and exposing the installer to potential injury.

Additionally, trade union rules may require that installation of various types of apparatus to be divided between various specialty trades, such as mechanics (e.g., for physically mounting the enclosure), electricians (e.g., for installing high-voltage wiring) and audio-video technicians (e.g., for audio-video device installation, hookup, and testing). With prior art enclosures, the audio-video technician cannot install the equipment until after the mechanic has installed the enclosure in the ceiling and the electrician has installed the wiring. The installer cannot therefore work concurrently with and independently of the electrician or mechanic. Further, the audio-video technician cannot easily make changes to the equipment configuration after the enclosure has been installed in the suspended ceiling.

BRIEF SUMMARY OF THE INVENTION

The present invention is a ceiling-mountable enclosure. In one or more embodiments, the apparatus of the present invention includes an enclosure comprising a support frame, a lightweight inner enclosure, and a back box configured for installation in a suspended ceiling. In one or more embodiments, the apparatus of the present invention includes a removable device door configured to be mounted to the support frame with a hinge assembly and machine screws. In one or more embodiments, the back box, inner enclosure, and support frame of the invention are assembled together and laid onto a suspended ceiling T-bar grid. In one or more embodiments, the support frame is attached to support members to support it from the structural ceiling. In one or more embodiments, wires, such as electrical and signal wires are routed through conduit access plates provided at the back box. In one or more embodiments, electrical or other equipment is mounted to a removable device door, and any required electrical and signal wires are connected to and routed between the equipment. In one or more embodiments, the removable device door with mounted equipment is attached to the support frame, then rotated upwards to fit flush with the ceiling and fastened to the support frame. In one or more embodiments, a variety of interchangeable removable equipment mounting plates with different mounting templates configured to be mounted to the removable device door are provided. In one or more embodiments, one or more wire tie points are integrated into the inner enclosure, removable device door, and/or equipment mounting plates. In one or more embodiments, a variety of power receptacles are provided that are configured to be mounted to either the back box, the inner enclosure, or the removable device door. In one or more embodiments, the enclosure includes a cooling system comprising an electrically powered fan and air ducts integrated into the inner enclosure.

BRIEF DESCRIPTION OF THE DRAWINGS

The present invention may be understood and its features made apparent to those skilled in the art by referencing the accompanying drawings.

DETAILED DESCRIPTION OF THE INVENTION

In the following description, numerous specific details are set forth to provide a more thorough description of the present invention. It will be apparent to one skilled in the art, however, that the present invention may be practiced without those specific details. In other instances, well-known features have not been described in detail so as not to unnecessarily obscure the invention.

Figure 1:
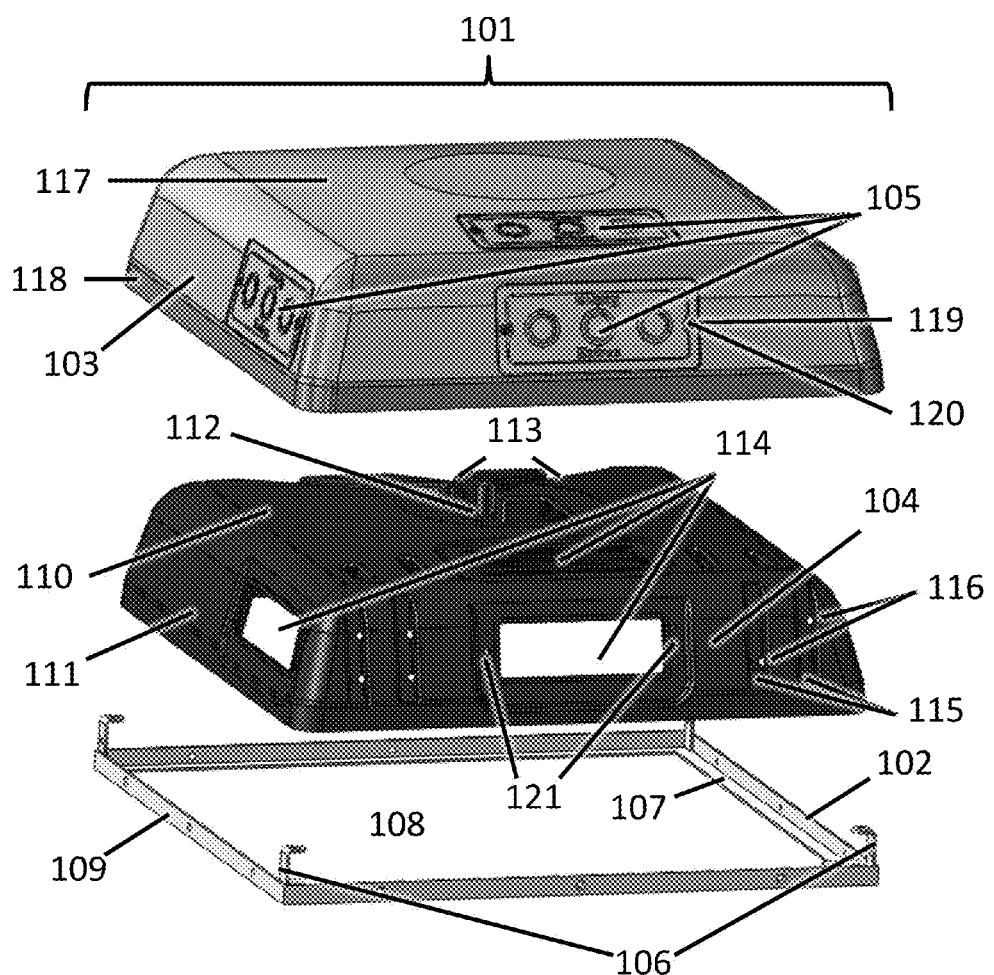
FIG. 1 is an exploded perspective view of an embodiment of the support frame, inner enclosure, and back box of the invention.

FIG. 1 is an exploded perspective view showing components of an enclosure 101 of an embodiment of the present invention. In the embodiment of FIG. 1, components of enclosure 101 include a support frame 102, a back box 103, an inner enclosure 104, conduit access plates 105, and mounting brackets 106.

In the embodiment of FIG. 1, support frame 102 is formed from steel, which has the desirable properties of high strength and rigidity. Support frame 102, however, can alternatively be formed from other suitable plastic, metal, or composite material or materials. In one or more embodiments, support frame 102 is formed as a sheet metal stamping. In the embodiment of FIG. 1, support frame 102 includes an inner lip portion 107, an opening 108, a vertical side portion 109, and mounting brackets 106. Support frame 102 may be secured to a structural support (i.e. ceiling) with threaded bolts or support cables that attach to mounting brackets 106. In one or more embodiments, vertical side portion 109 is initially formed at an approximately right angle to inner lip portion 107. In one or more embodiments, support frame 102 is formed from a sheet of material. In one or more embodiments, support frame 102 is formed from angle iron. Support frame 102 need not be formed from a single piece of material, but may be assembled from separately formed pieces. In alternative embodiments, vertical side portion 109 is not integrally formed with inner lip portion 107, but is made from separately formed components that are affixed to inner lip portion 107 to form support frame 102. In the embodiment of FIG. 1, support frame 102 has a single centrally-located square opening 108 for receiving a ceiling tile or grille. Although support frame 102 is shown as having a generally rectangular shape, any other desired shape can be used.

In the embodiment of FIG. 1, inner enclosure 104 comprises a top portion 110 and a side portion 111. In one or more embodiments, top portion 110 comprises a fan pocket 112 and ducts 113. In one or more embodiments, fan pocket 112 is provided with a blower fan that pulls hot air from the interior of the enclosure and directs the hot air along the ducts 113 to one or more air outlets (not visible) in the bottom of the enclosure. In one or more embodiments, side portion 111 comprises one or more conduit access openings 114. In one or more embodiments, cables and/or wires from outside the enclosure enter the interior of the enclosure through the conduit access openings 114. In one or more embodiments, side portion 111 comprises a plurality of stiffening ribs 115. In one or more embodiments, top portion 110 and/or side portion 111 comprise a plurality of wire anchor points 116 that allow wires and cables inside the enclosure 104 to be secured to the enclosure 104. In one or more embodiments, wires and cables are secured with cable clips, with cable ties, with metal wire, or with string. In one or more embodiments, inner enclosure 104 is formed from high molecular weight polyethylene ("HMWPE"), which has desirable properties of light weight, low cost, high strength, and ease of molding into complex shapes. Inner enclosure 104 may however be formed from any other plastic, metal, or composite material or materials. In one or more embodiments, using a relatively heavier material such as metal only for support frame 102 while using a lightweight material such as HMWPE for inner enclosure 104 results in a lighter overall weight for the enclosure of the invention than that of the enclosures of the prior art.

In the embodiment of FIG. 1, back box 103 is configured to be mountable over inner enclosure 104 such that the inside surface of back box 103 conforms generally to the outside surface of inner enclosure 104. In one or more embodiments, the inside surface of back box 103 conforms to the outside surface of inner enclosure 104 such that air blown through fan pocket 112 and ducts 113 is directed along the ducts 113 and does not escape to other parts of the enclosure. In one or more embodiments, back box 103 includes a top portion 117 and a side portion 118. In one or more embodiments, back box 103 is formed from materials known in the art that provide fire and heat resistance in conformity with applicable building codes. In one or more embodiments, back box 103 comprises a composite construction comprising an inner mineral fiber or fiberglass shell and an outer metal foil layer. In one or more embodiments, back box 103 conforms to the Underwriters' Laboratories UL2043 rating. In one or more embodiments, back box 103 includes one or more cover plates 105 that cover openings in back box 103 and inner enclosure 104. In one or more embodiments, each cover plate 105 comprises a pair of mounting holes 119. In one or more embodiments, threaded fasteners 120, e.g. screws or bolts, pass through mounting holes 119 and screw into holes 121 in inner enclosure 104, thereby securing cover plates 105 to back box 103 and inner enclosure 104.

Enclosure 101 can have any desired shape and dimensions. In one or more embodiments, the overall length and width of enclosure 101 are each approximately 2 feet, which is a standard length and width for ceiling tiles in the United States. Other standard lengths and widths for ceiling tiles in the United States are 1 foot by 2 foot and 2 foot by 4 foot, and in one or more embodiments enclosure 101 has dimensions corresponding to these other standard ceiling tile sizes. In one or more embodiments, the overall length and width of enclosure 101 are each approximately 600 mm, which are standard lengths and widths for ceiling tiles in some European countries. In one or more embodiments, the overall length and width of enclosure 101 are each approximately 625 mm, which are standard lengths and widths for ceiling tiles in some European countries. Other standard lengths and widths for ceiling tiles in European countries are 300 mm by 600 mm and 600 mm by 1200 mm, and in one or more embodiments enclosure 101 has dimensions corresponding to these other European standard ceiling tile sizes.

In the embodiment of FIG. 1, support frame 102, inner enclosure 104, and back box 103 are assembled together to form an embodiment of an enclosure of the invention. In one or more embodiments, back box 103 and inner enclosure 104 are fastened to support frame 102 using a plurality of screws or other fasteners. In one or more embodiments, back box 103 and inner enclosure are fastened to support frame 102 using adhesive. In one or more embodiments, when assembled, the components work together to form an assembled enclosure that has a rigidity greater than the rigidity of the individual components.

Figure 2:
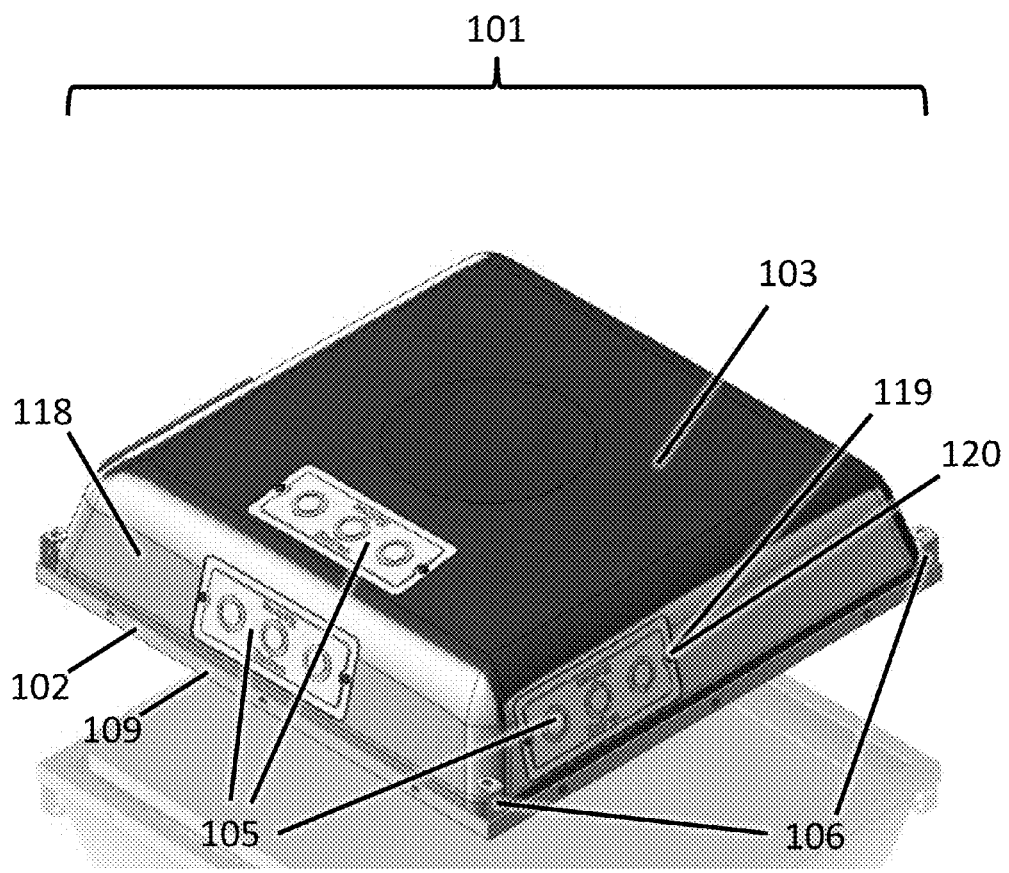
FIG. 2 is a perspective view of an embodiment of an assembled enclosure of the invention.

FIGS. 1 and 2 show how enclosure 101 is assembled in one or more embodiments of the invention. As shown in FIG. 2, side portion 111 of inner enclosure 104 is configured to fit within opening 108 of support frame 102 and rest upon inner lip portion 107 of support frame 102. In the embodiment of FIGS. 1 and 2, back box 103 is configured to be mountable over inner enclosure 104 such that the inside surface of back box 103 conforms generally to the outside surface of inner enclosure 104. In the embodiment of FIGS. 1 and 2, side portion 118 of back box 103 is configured to rest upon inner lip portion 107 of support frame 102 adjacent to side portion 111 of inner enclosure 104. In one or more embodiments, back box 103 and inner enclosure 104 are fastened to support frame 102 using a plurality of screws or other fasteners. In one or more embodiments, back box 103 and inner enclosure 104 are fastened to support frame 102 using adhesive.

Figure 3:
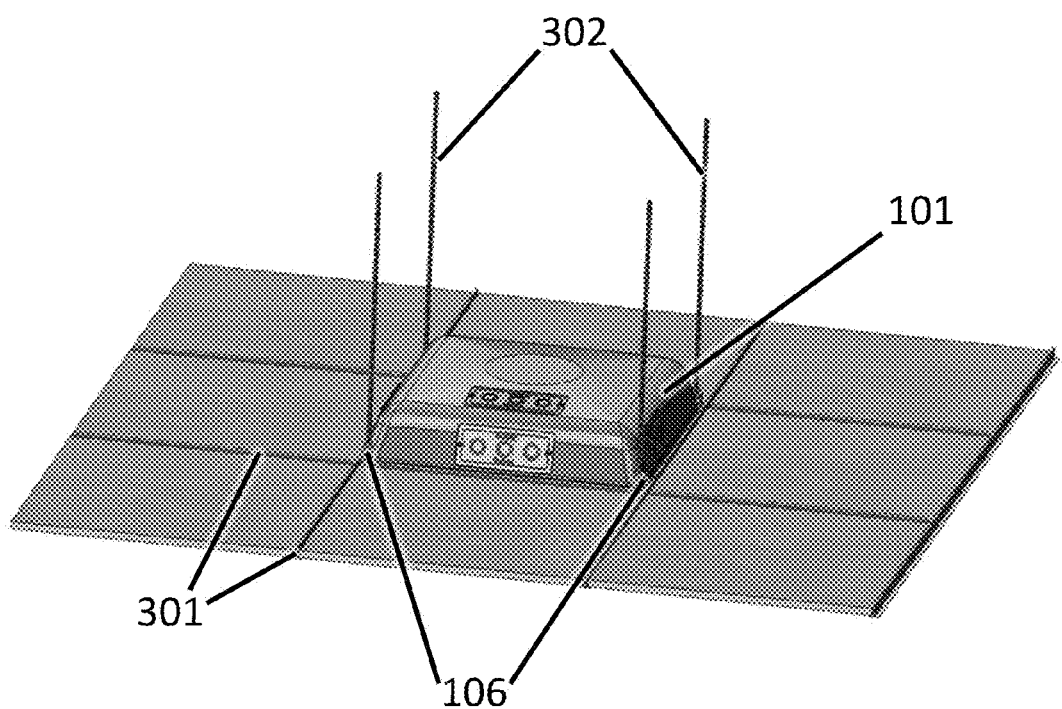
FIG. 3 is a perspective view of an embodiment of an assembled enclosure of the invention, installed in a suspended ceiling, as viewed from above the ceiling.

FIG. 3 shows how enclosure 101 is installed in a suspended ceiling in one or more embodiments of the invention. In the embodiment shown in FIG. 3, support frame 102 rests upon suspended ceiling T-bar framework 301. In the embodiment of FIG. 3, each support member 302 is secured to a mounting bracket 106 at one end and anchor points on a structural ceiling (e.g., ceiling joists) at the other end. In one or more embodiments, support member 302 is a threaded rod which passes through a hole in mounting bracket 106 and is secured thereto with one or more threaded fasteners, e.g. hex nuts. In one or more embodiments, the threaded rod measures 3/8" in diameter and has 16 threads per inch. In one or more embodiments, support member 302 is metal or polymer cable, which may be solid or stranded. In one or more embodiments, enclosure 101 is lightweight enough that it may be laid onto and temporarily supported by suspended ceiling T-bar framework 301 before being secured to the structural ceiling with support members 302. Being able to lay enclosure 101 onto T-bar framework 301 prior to installing support members 302 facilitates safety and ease of installation, because an installer can use both hands to secure enclosure 101 to the support members 302, instead of supporting enclosure 101 with one hand while securing it to the support members 302 with the other hand.

Figure 4:
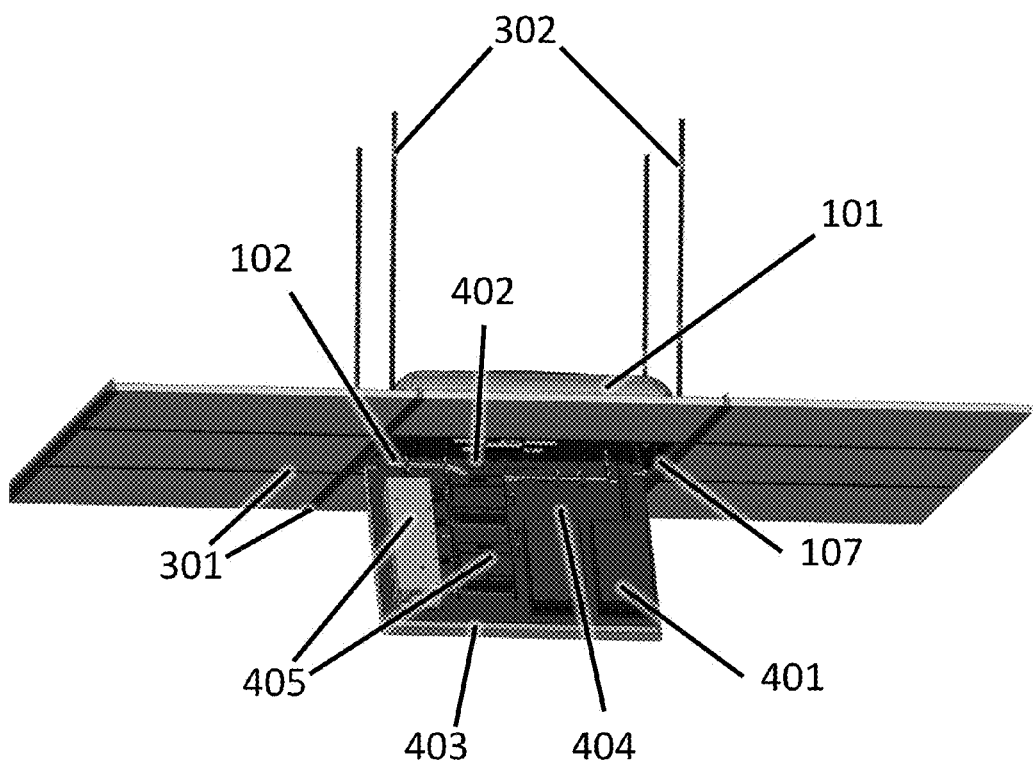
FIG. 4 is a perspective view of an embodiment of an assembled enclosure of the invention with the device door open, installed in a suspended ceiling, as viewed from below the ceiling.

FIG. 4 shows enclosure 101 installed in a suspended ceiling, with device door 401 installed and in the open position, in one or more embodiments of the invention. In the embodiment shown in FIG. 4, inner lip portion 107 of support frame 102 rests upon suspended ceiling T-bar framework 301. In the embodiment of FIG. 4, each support member 302 is secured to a mounting bracket 106 (not visible) at one end and anchor points on the structural ceiling at the other end. In the embodiment shown in FIG. 4, device door 401 comprises a hinged edge 402 and a free edge 403. In the embodiment of FIG. 4, hinged edge 402 of device door 401 attaches to support frame 102 with a hinge assembly, shown in detail in FIGS. 11 through 13. In one or more embodiments, device door 401 may be detached from support frame 102 and moved, e.g., to a workbench so that equipment may be installed or removed easily and safely. In one or more embodiments, equipment mounting panel 404 attaches to device door 401 with fasteners, such as screws, bolts, or rivets. In one or more embodiments, equipment 405 (which may be electronic or other equipment) is mounted to equipment mounting panel 404. In one or more embodiments, equipment mounting panel 404 with attached equipment 405 is removable from device door 401. In one or more embodiments, mounting panel 404 may be detached from device door 401 while device door 401 remains attached to support frame 102 and moved, e.g., to a workbench so that equipment may be installed or removed easily and safely. Thereafter mounting panel 404 with the attached equipment is attached to device door 401 which may remain attached to support frame 102. In one or more embodiments, device door 401 may be reattached to support frame 102 (if it has been removed) after equipment 405 is attached by hanging hinged edge 402 of device door 401 to a mating hinge assembly on support frame 102 while in the vertical, open position. In one or more embodiments, after attaching hinged edge 402 to support frame 102, device door 401 is swung up, pivoting on hinged edge 402, toward support frame 102 to sit parallel to and flush with the ceiling. In one or more embodiments, free edge 403 of device door 401 is fastened to support frame 102 with removable fasteners, such as screws or bolts. In one or more embodiments, free edge 403 of device door 401 is fastened to support frame 102 with a latching mechanism.

Figure 5:
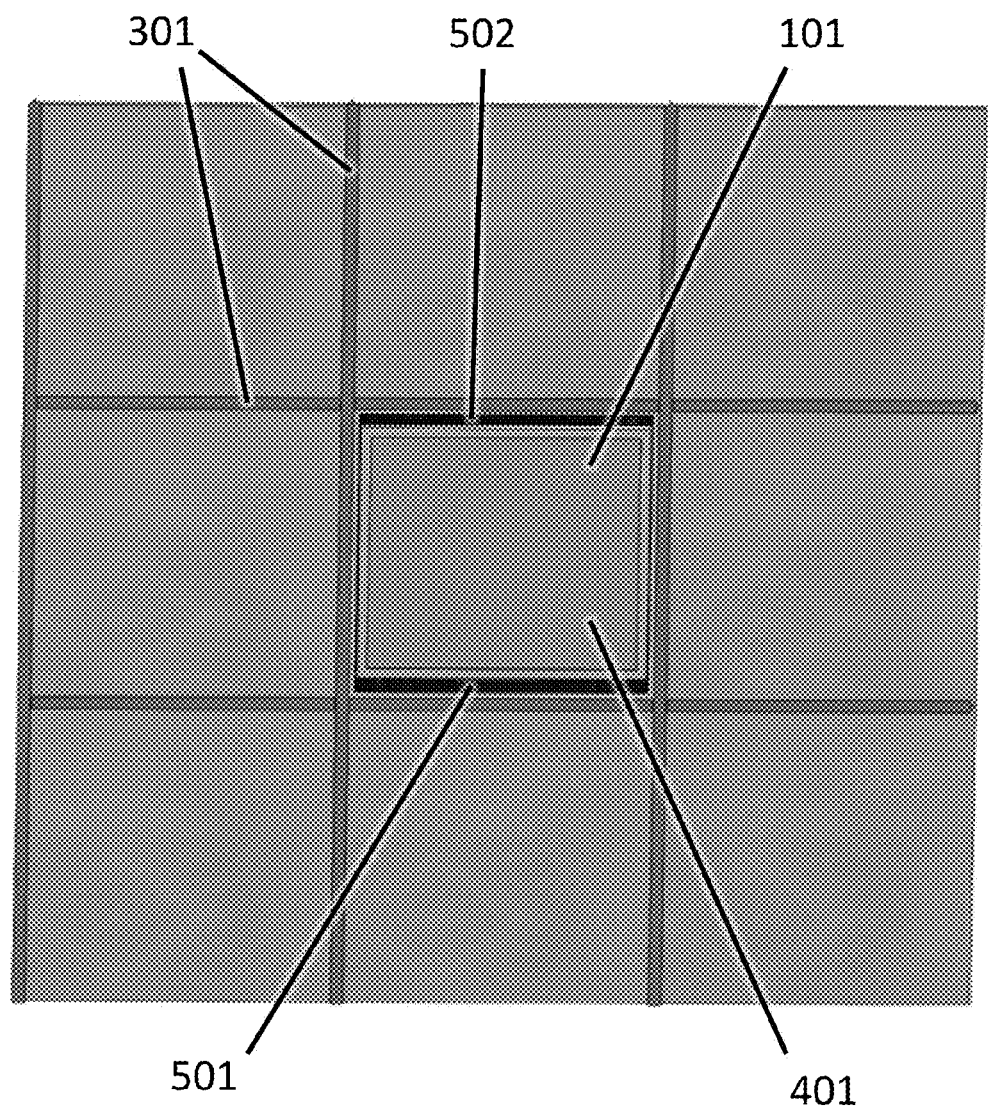
FIG. 5 is a view of an embodiment of an assembled enclosure of the invention with the device door closed, installed in a suspended ceiling, as viewed from below the ceiling.

FIG. 5 shows a bottom view of the enclosure 101 installed in a suspended ceiling, with the device door 401 installed and in the closed position, in one or more embodiments of the invention. In the embodiment of FIG. 5, device door 401 is narrower than support frame 102, such that air gaps 501 and 502 are formed between device door 401 and support frame 102. In one or more embodiments, air gap 501 allows room temperature air to be drawn from the room into the interior of enclosure 101, for example by an electrical fan mounted adjacent to fan pocket 112. In one or more embodiments, air gap 502 allows hot air to be discharged from channels on the exterior of inner enclosure 104 as further described with respect to FIGS. 6 through 9 below. In one or more embodiments, air gaps 501 and 502 allow various patterns of air inflow and air outflow, as determined by the configuration of air ducts and air vents of enclosure 101. In one or more embodiments, the configuration of air ducts and air vents of enclosure 101 can be tuned to force air to flow in specific patterns within enclosure 101, allowing specific areas to be cooled at different rates, or to allow the entire enclosure 101 to be cooled uniformly to prevent hot spots. In one or more embodiments, one or more openings may be cut in back box 103 to connect enclosure 101 with building heating, ventilation, and air conditioning (HVAC) ducts. In one or more embodiments, an HVAC return duct allows hot air to be exhausted from enclosure 101. In one or more embodiments, an HVAC supply duct allows cool air to be supplied to enclosure 101. In one or more embodiments, an air filter is placed over air gap 501 or 502, or over one or more HVAC ducts, to filter the air flowing through enclosure 101.

Figure 6:
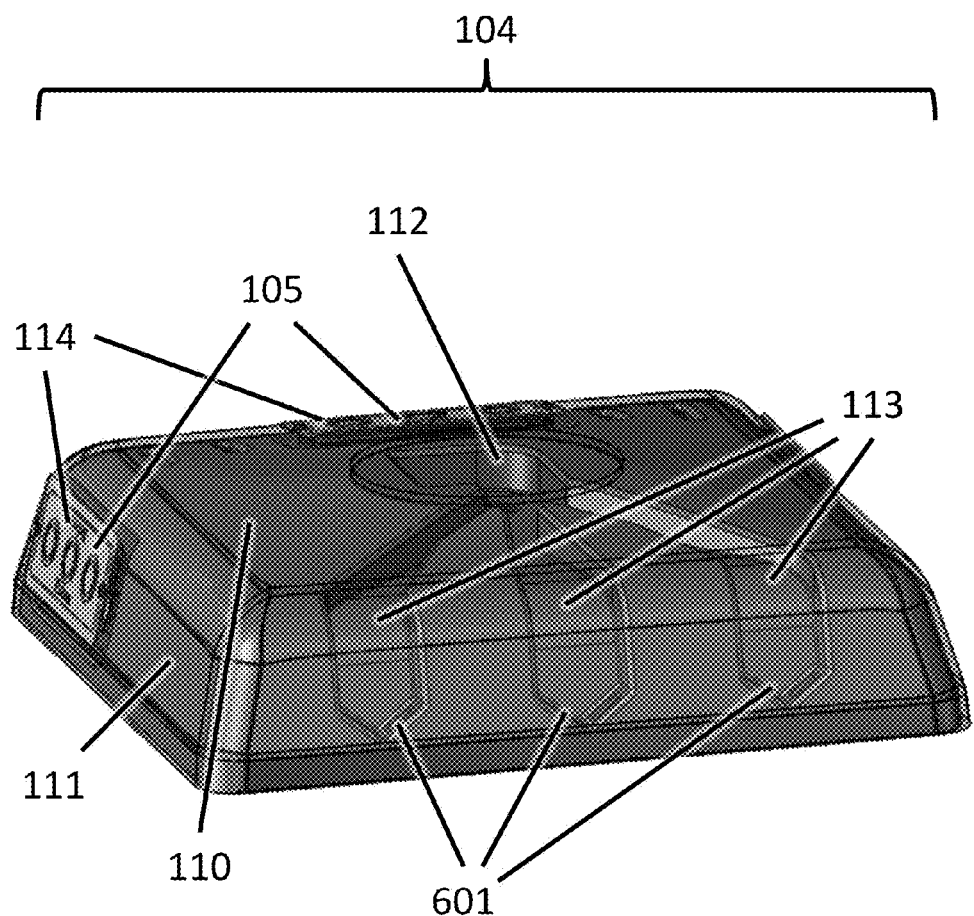
FIG. 6 is a perspective view of an embodiment of the inner enclosure of the invention.
Figure 7:
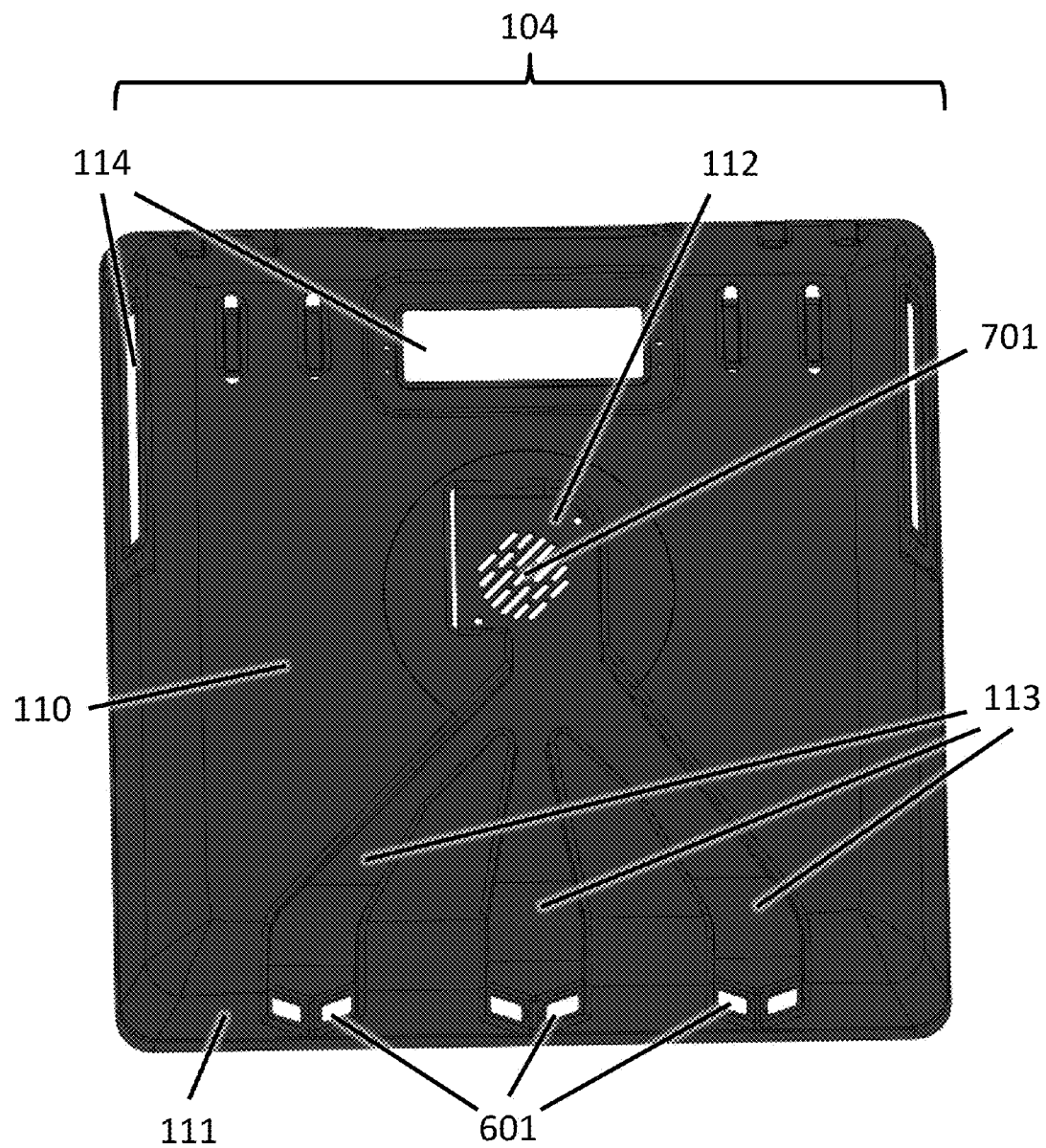
FIG. 7 is a top view of an embodiment of the inner enclosure of the invention.
Figure 8:
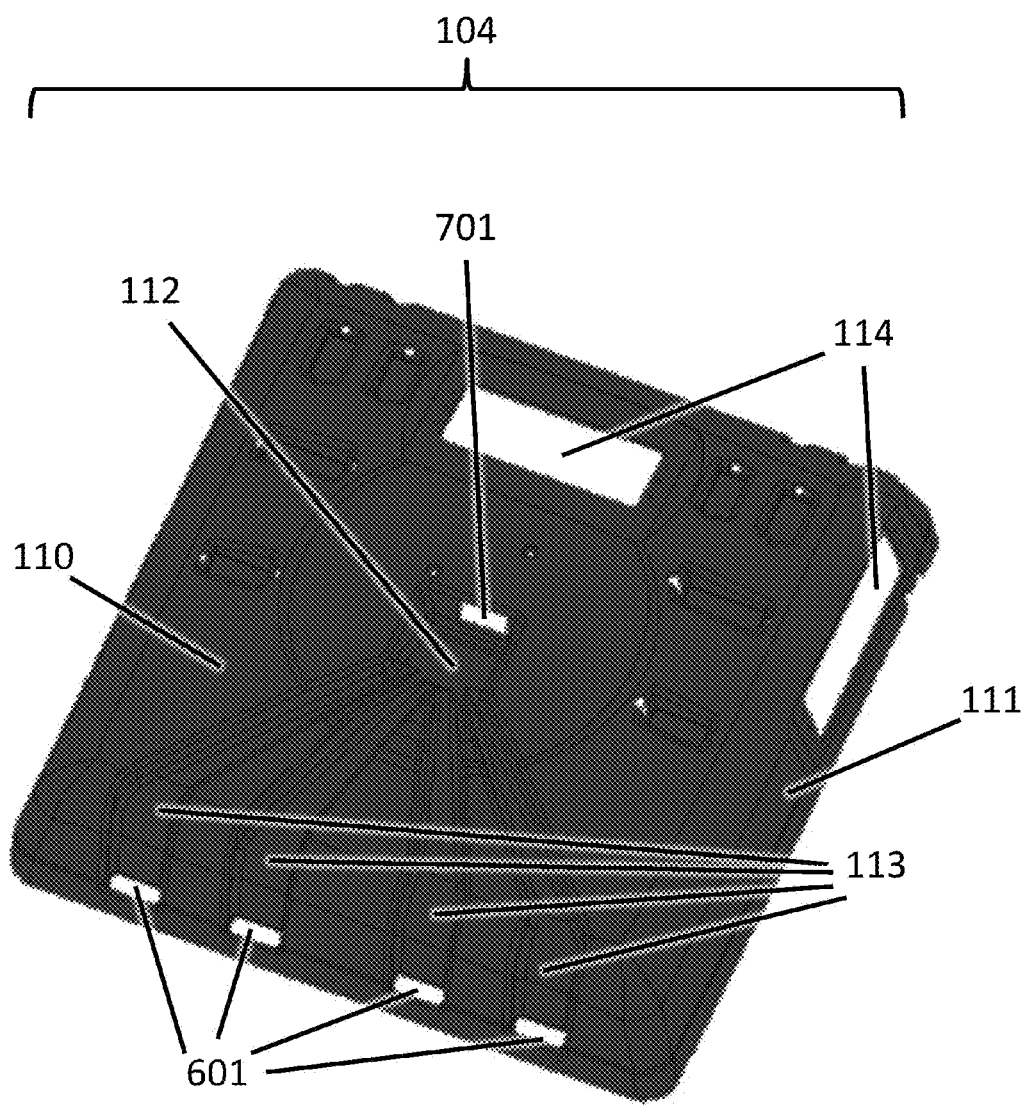
FIG. 8 is a perspective view of an embodiment of the inner enclosure of the invention.
Figure 9:
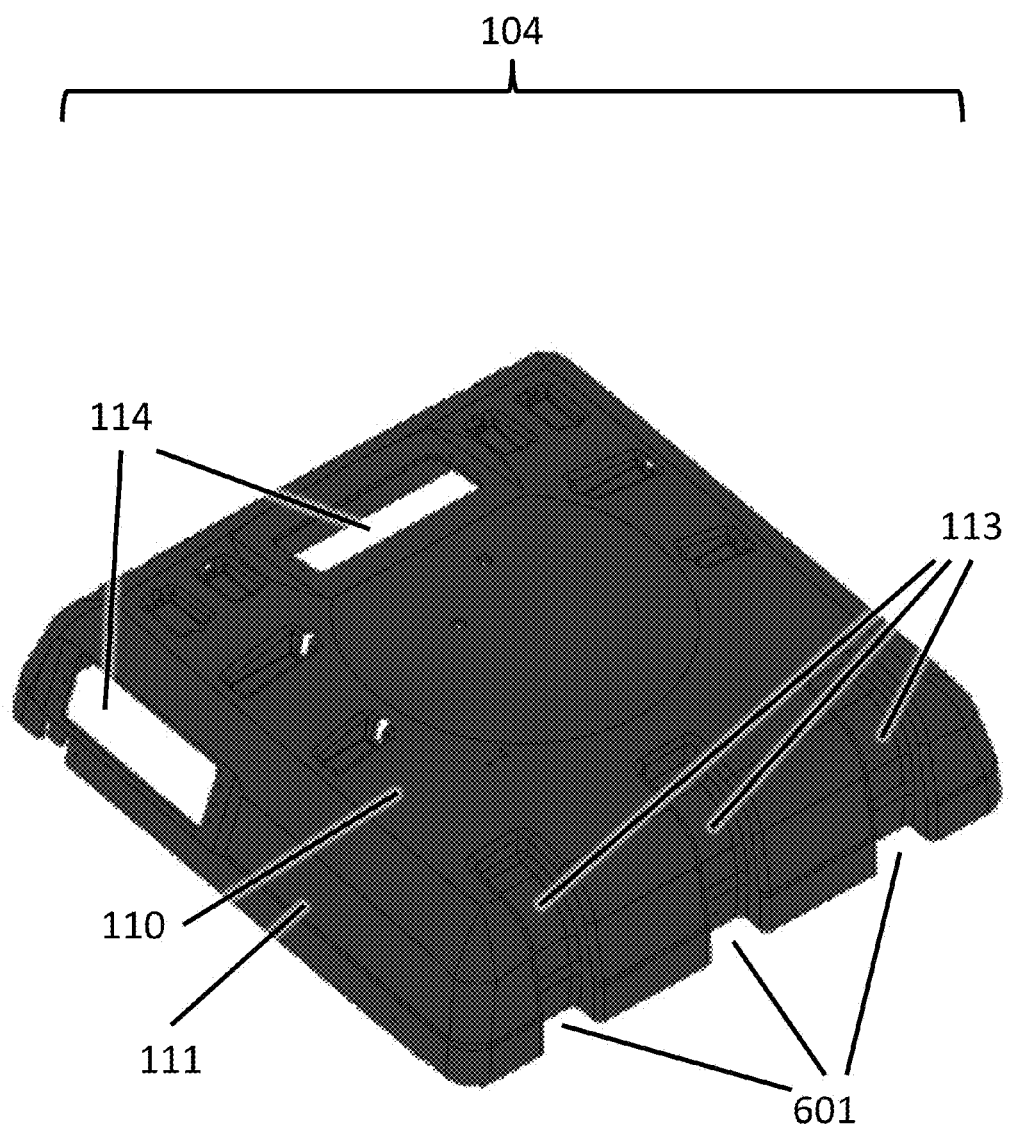
FIG. 9 is a perspective view of an embodiment of the inner enclosure of the invention.

FIGS. 6 through 9 show different embodiments of inner enclosure 104. In the embodiments of FIGS. 6 though 8, top portion 110 of inner enclosure 104 comprises a fan pocket 112, air vent 701 (shown in FIGS. 7 and 8), and ducts 113. In one or more embodiments, a fan (e.g., an axial fan, a radial blower fan, a cross flow fan, etc.) is mounted adjacent to fan pocket 112 to pull hot air through air vent 701 from the interior of the enclosure and direct the hot air along ducts 113 to one or more air outlets 601 adjacent to the lower edge of inner enclosure 104. Alternatively, the air flow can be in the other direction, with the fan drawing air through air outlets 601 adjacent to the bottom edge of inner enclosure 104, through ducts 113, and blowing the air through air vent 701 into inner enclosure 104 and out through air gap 501 and/or 502. In the embodiment of FIG. 9, fan pocket 112 and air vent 701 are omitted. In one or more embodiments, one or more of the top ends of ducts 113 are open to the interior of enclosure 104. In one or more embodiments, one or more fans are mounted within the interior of inner enclosure 104 to produce the desired airflow pattern. In the embodiment of FIGS. 6 through 9, ducts 113 are molded into top portion 110 and side portion 111 of inner enclosure 104. In one or more embodiments, the inside surface of back box 103 (see FIG. 1) conforms to the outside surface of inner enclosure 104 such that air drawn from the interior of inner enclosure 104 though fan pocket 112 and directed along ducts 113 to the outside of enclosure 101, thereby removing heat generated by electrical equipment mounted in enclosure 101. In the embodiments of FIGS. 6 and 7, air outlets 601 are angled to diffuse the exhausting air to prevent "hot spots" and to reduce airflow noise. In the embodiment of FIG. 8, air outlets 601 have coplanar openings. In the embodiment of FIG. 9, air outlets 601 are extensions of ducts 113 formed by assembling back box 103 over inner enclosure 104. In one or more embodiments, an air filter is placed over air vent 701, or over one or more air outlets 601, to filter the air flowing through enclosure 101.

In the embodiments of FIGS. 6 through 9, inner enclosure 104 comprises one or more conduit access openings 114, which may be covered with removable conduit access plates 105. In one or more embodiments, as shown for example in FIG. 1, back box 103 comprises access openings that correspond to access openings 114 of inner enclosure 104, both of which are covered by access plates 105. In one or more embodiments, cables and/or wires from outside enclosure 101 enter the interior of inner enclosure 104 through conduit access openings 114 and the corresponding openings in back box 103. In one or more embodiments, conduit access plates 105 are provided with one or more punch out openings that can be removed without removing conduit access plates 105 to allow conduit to pass into the interior of the enclosure.

Figure 10:
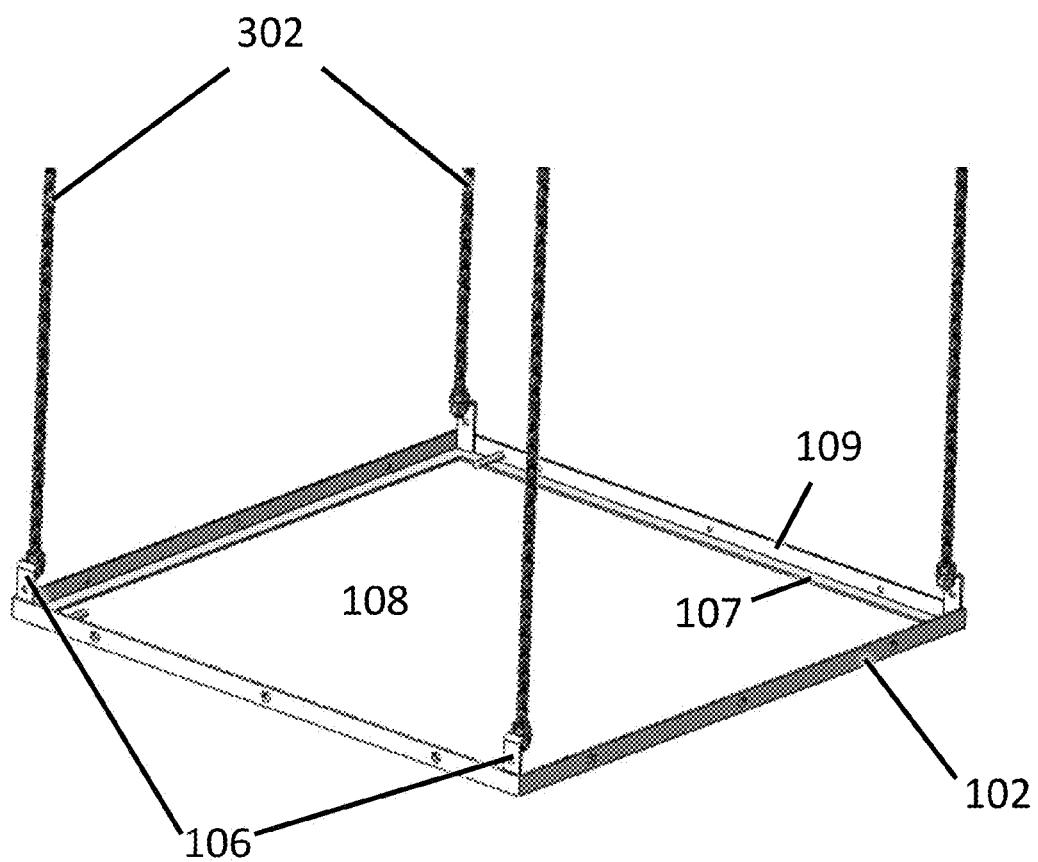
FIG. 10 is a perspective view of an embodiment of the support frame of the invention, with support cables attached.
Figure 11:
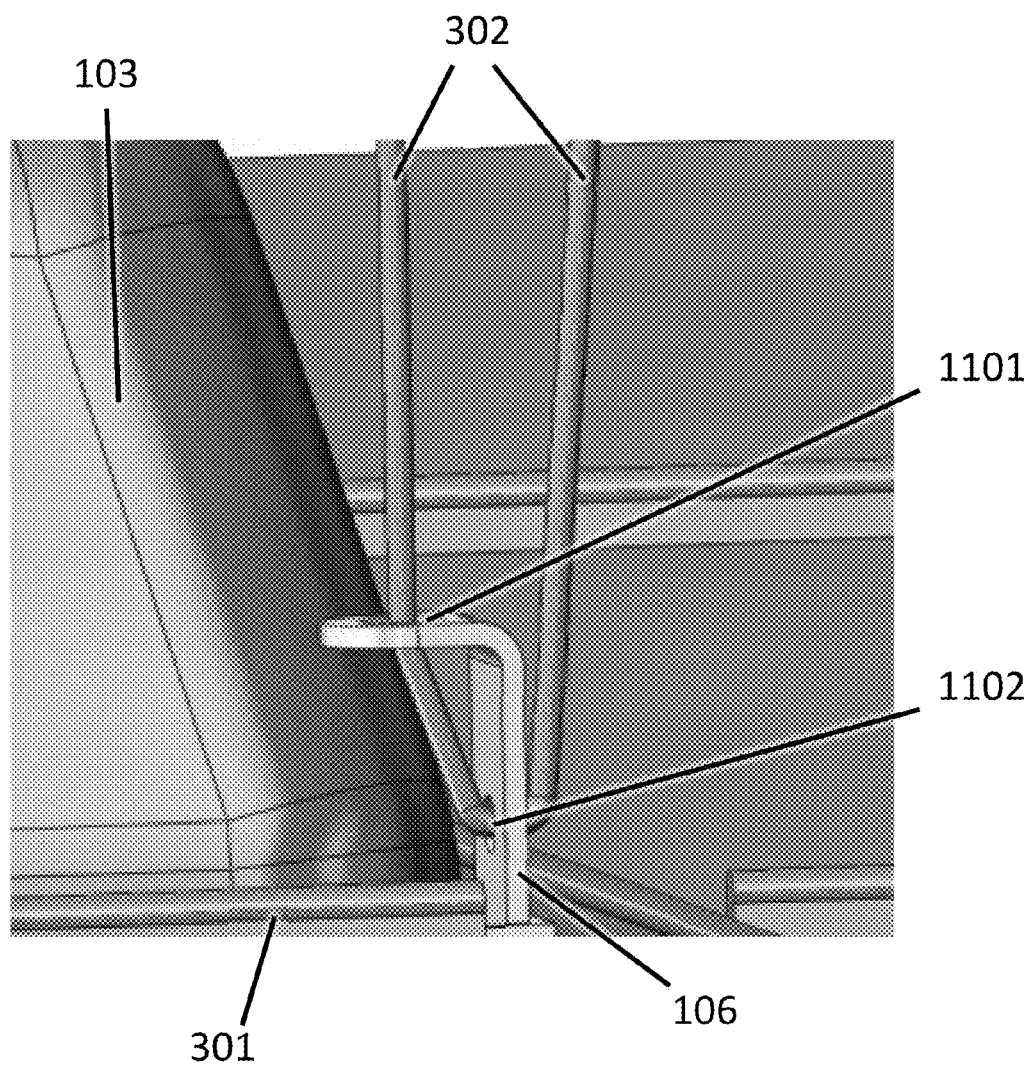
FIG. 11 is a detail view of the mounting brackets on an embodiment of the support frame of the invention.
Figure 12:
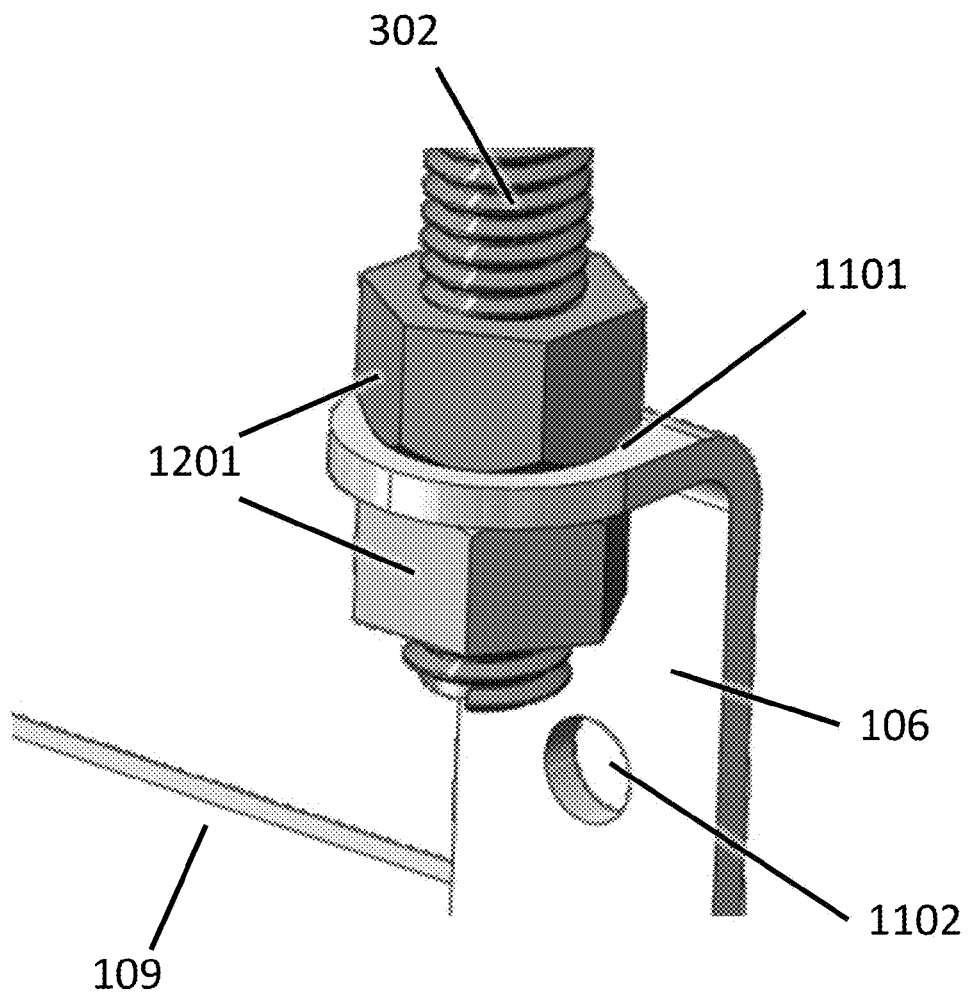
FIG. 12 is a detail view of the mounting brackets on an embodiment of the support frame of the invention.

FIGS. 10 through 12 show the details of support frame 102 and support members 302 in one or more embodiments of the invention. In the embodiment of FIGS. 10 and 12, support member 302 is a threaded rod which passes through hole 1101 in mounting bracket 106 and is secured thereto with one or more threaded fasteners 1201, e.g. hex nuts. In the embodiment of FIG. 9, support member 302 is metal or polymer cable, which may be solid or stranded, which passes through holes 1101 and 1102 in mounting bracket 106 and is secured to a structural ceiling.

Figure 13:
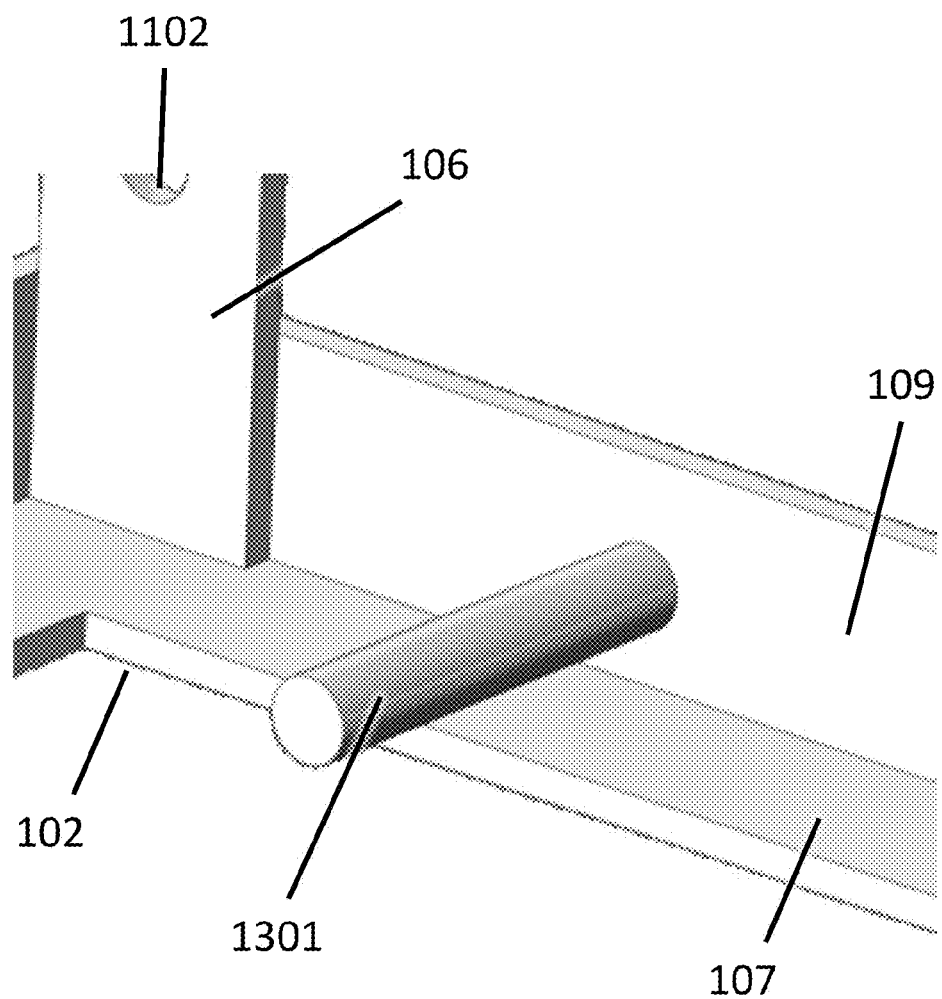
FIG. 13 is a detail view of the door hinge pins on an embodiment of the support frame of the invention.
Figure 14:
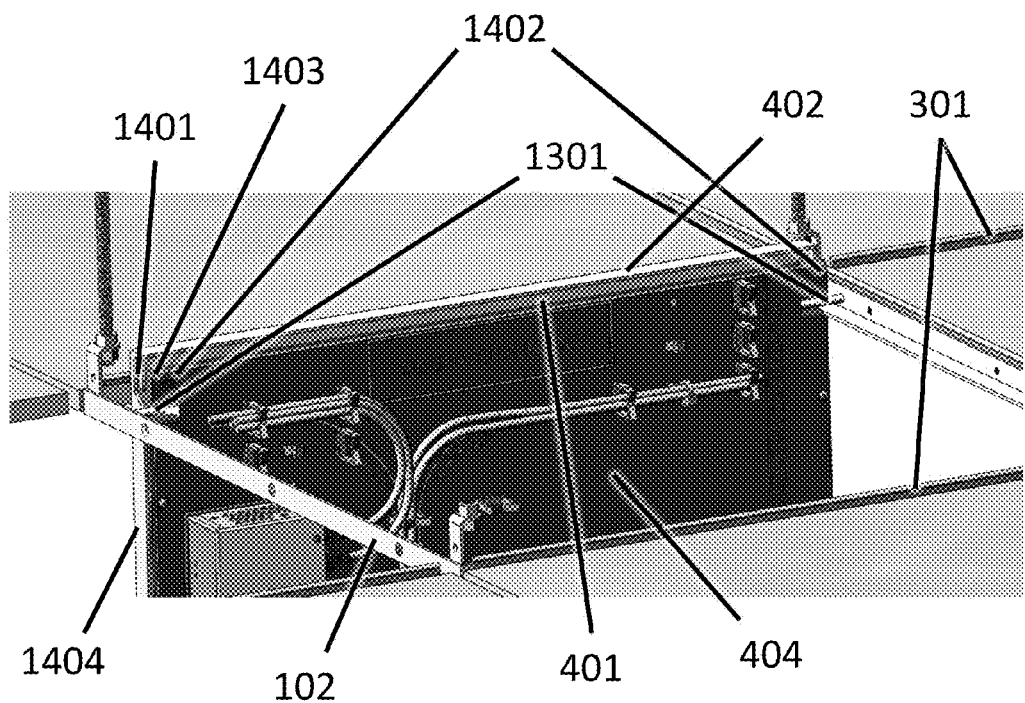
FIG. 14 is a perspective view of embodiments of the removable device door, support frame, and hinge assembly of the invention.
Figure 15:
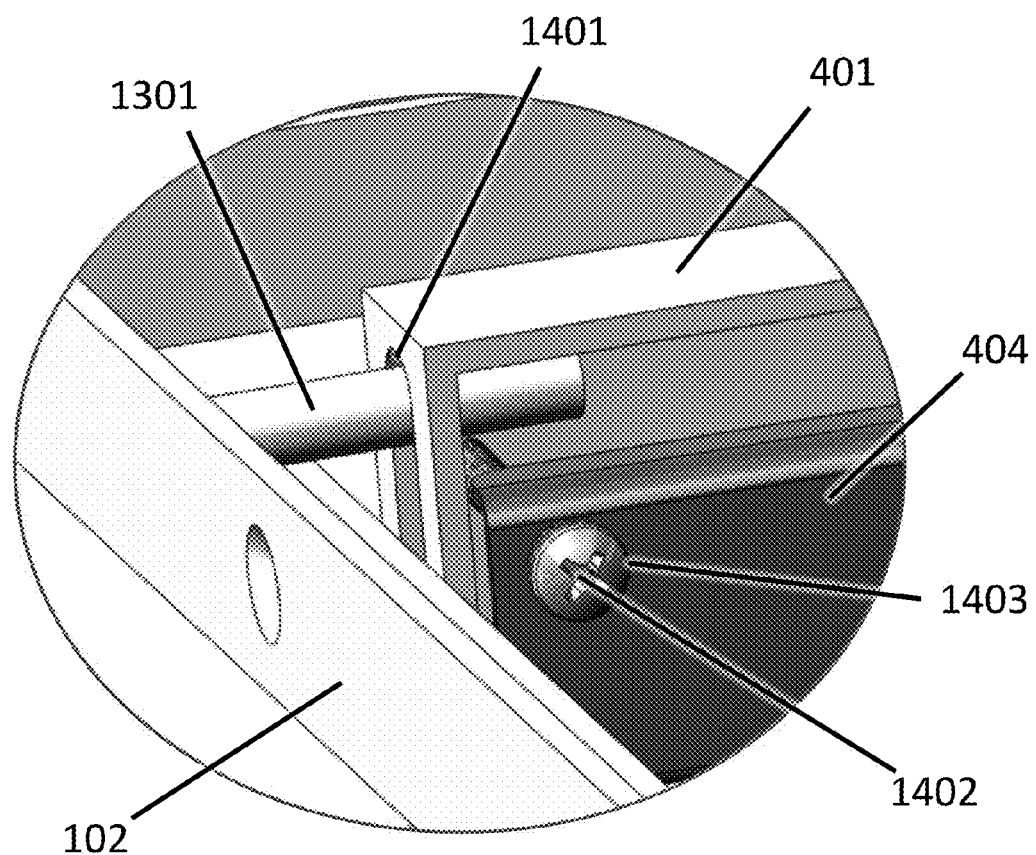
FIG. 15 is a detail perspective view of embodiments of the removable device door, support frame, and hinge assembly of the invention.

FIGS. 13 through 15 show the details of device door 401 hinge mechanism in one or more embodiments of the invention. In the embodiment of FIGS. 13 through 15, door hinge pin 1301 extends from vertical side portion 109 of support frame 102 into the interior of the region bounded by support frame 102. In one or more embodiments, door hinge pin 1301 is parallel to one edge of support frame 102. In the embodiment of FIGS. 14 and 15, support frame 1404 of device door 401 comprises an angled pin engagement slot 1401 shaped so that door hinge pin 1301 engages slot 1401 as device door 401 is fitted to support frame 102 so as to support device door 401 along hinged end 402. In the embodiment of FIGS. 14 and 15, after hinge pin 1301 is fully engaged in slot 1401, lock screw 1402 is fastened through threaded hole 1403 in equipment mounting panel 404 to prevent device door 401 from being lifted and disengaging slot 1401 from door hinge pin 1301.

Figure 16:
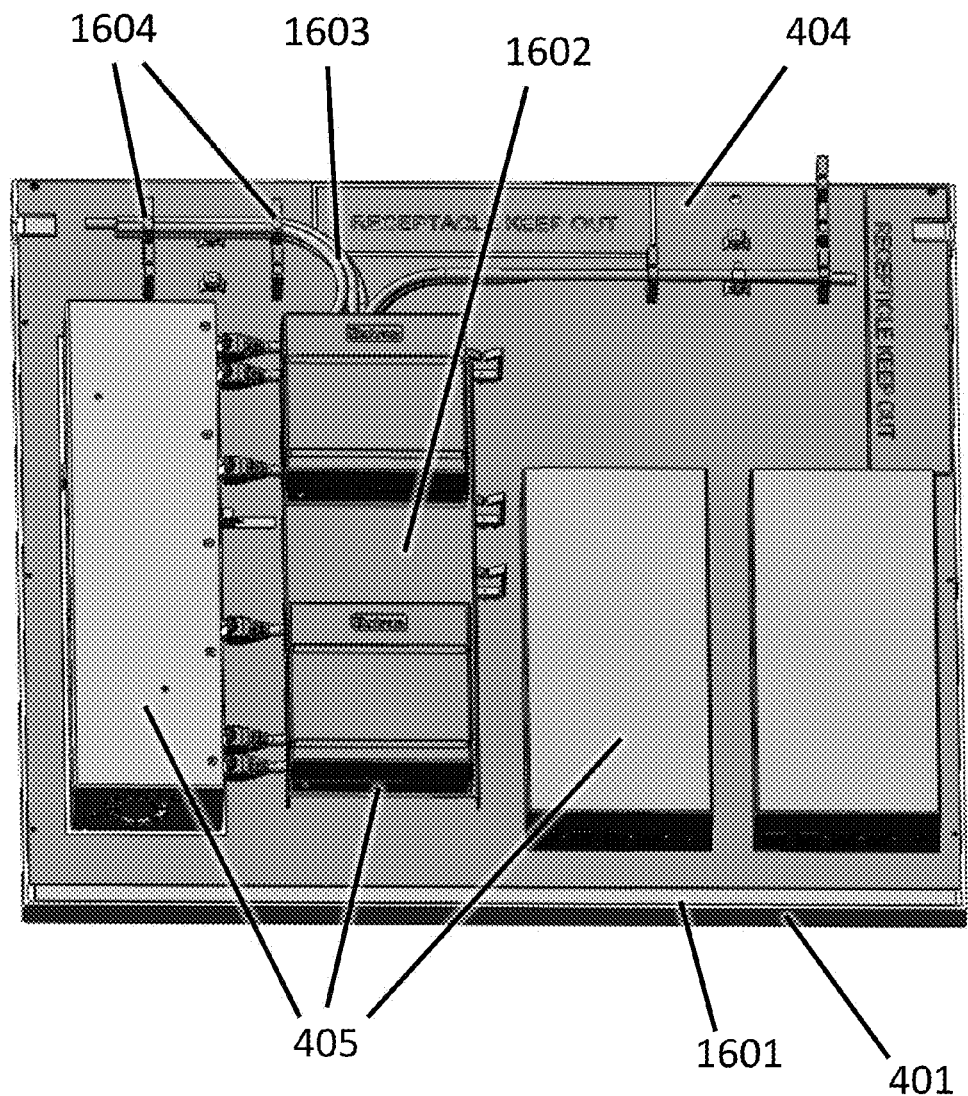
FIG. 16 is a perspective view of an embodiment of the removable device door of the invention with equipment attached.
Figure 17:
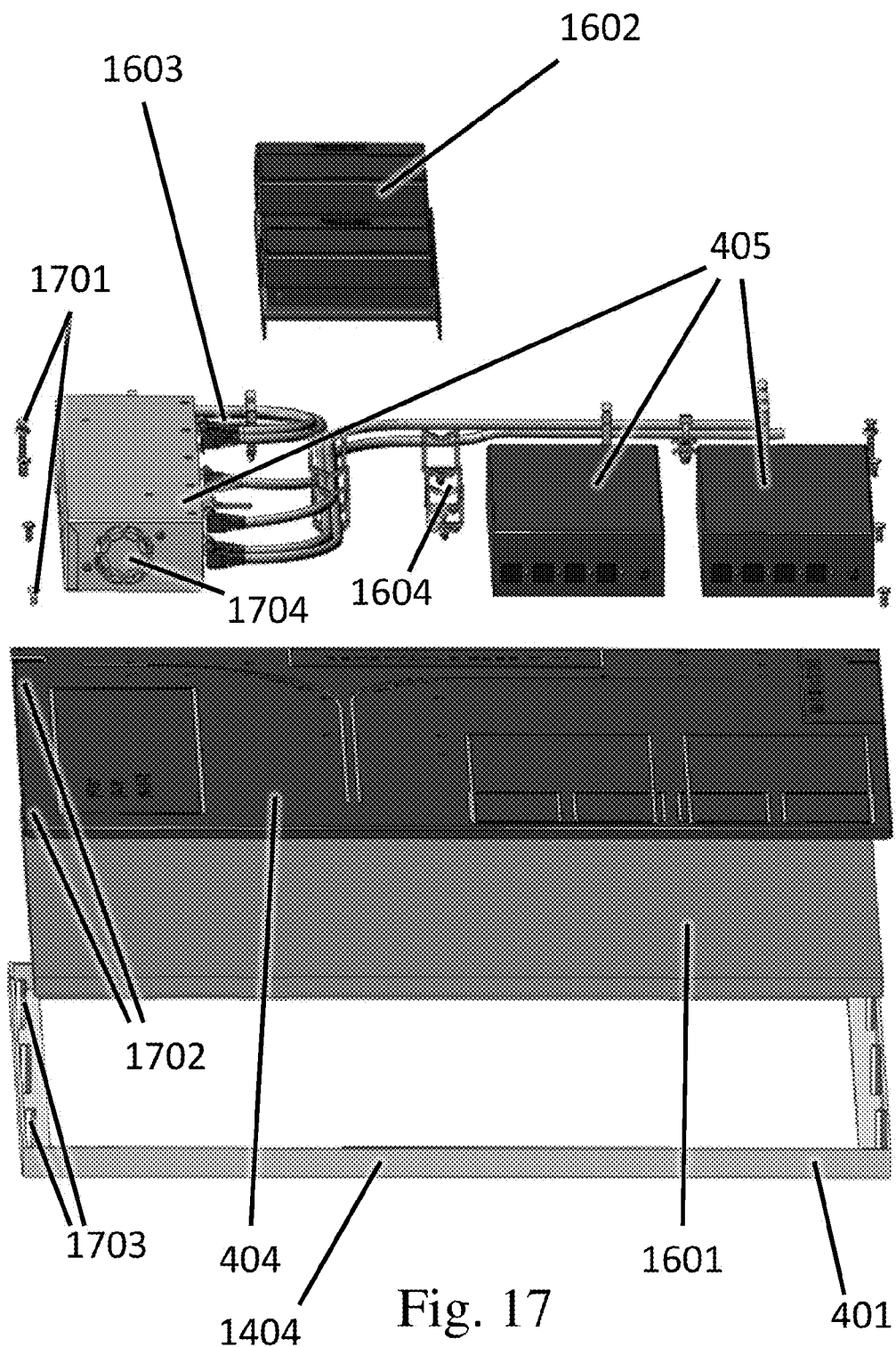
FIG. 17 is an exploded perspective view of an embodiment of the removable device door of the invention with equipment.
Figure 18:
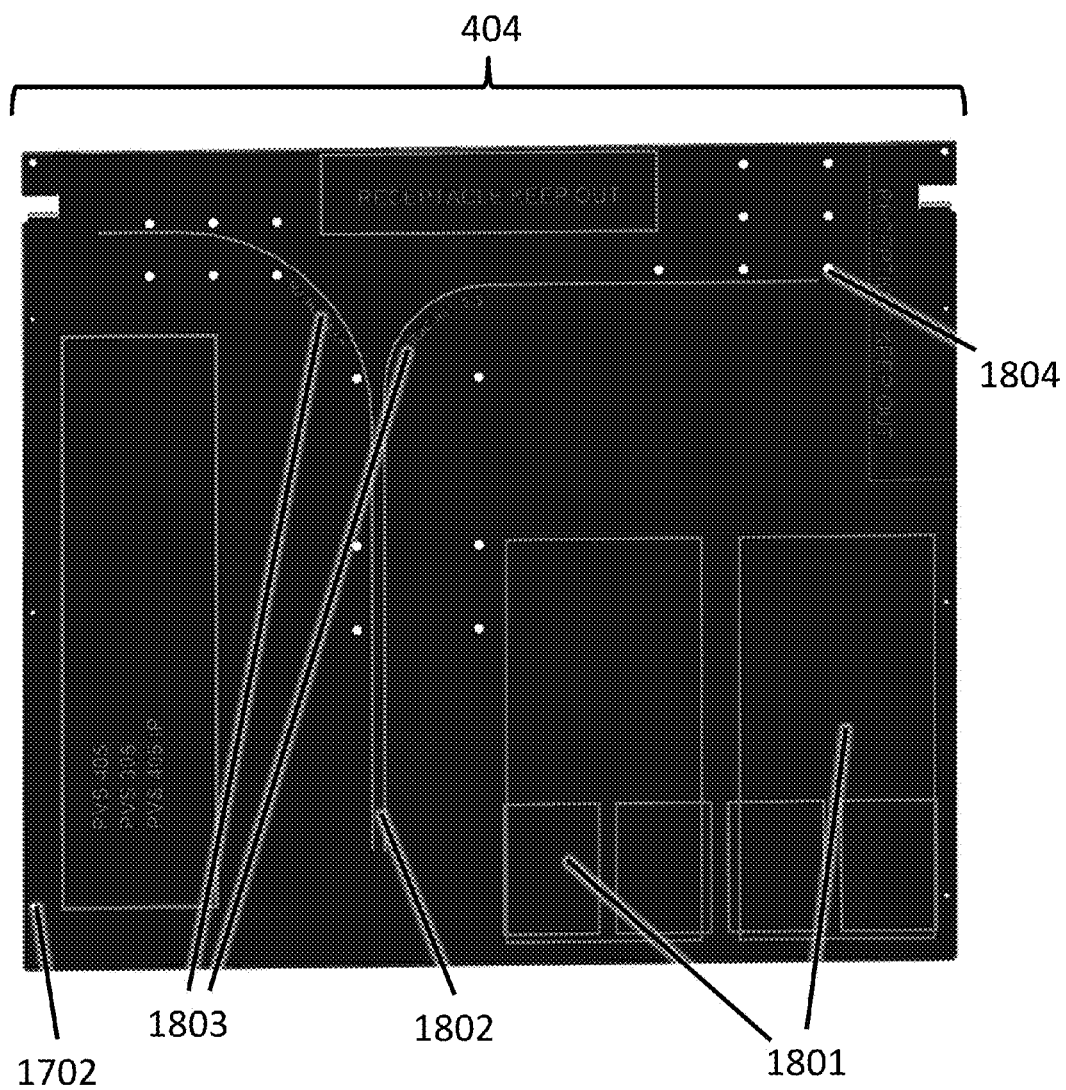
FIG. 18 is a top view of an embodiment of the equipment mounting panel of the invention.

FIGS. 16 through 19 show how equipment may be mounted to device door 401 in one or more embodiments of the invention. In the embodiment of FIG. 17, device door 401 comprises a support frame 1404, which may be constructed in a similar manner to support frame 102. A ceiling tile or grille 1601 is placed upon support frame 1404, and equipment mounting plate 404 is placed upon ceiling tile or grille 1601. In the embodiment of FIG. 17, threaded fasteners (e.g., screws or bolts) 1701 pass through holes 1702 in equipment mounting plate 404 and attach to threaded standoffs 1703 affixed to support frame 1404, thereby securing equipment mounting plate 404 and ceiling tile or grille 1601 to device door 401. In the embodiments of FIGS. 16 and 17, equipment 405 is mounted to equipment mounting plate 404. In the embodiment of FIG. 17, one or more of equipment 405 include an equipment cooling fan 1704 that can help cool the equipment in enclosure 101.

Figure 19:
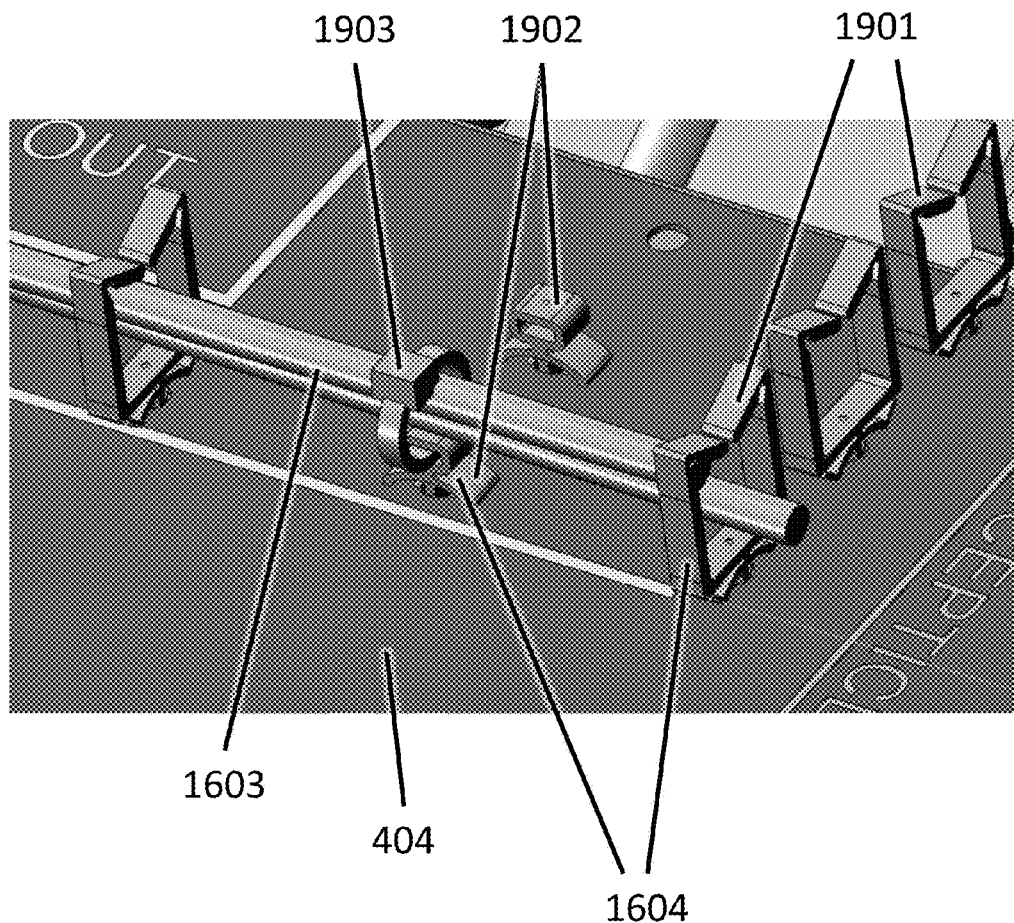
FIG. 19 is a detail perspective view of wire routing clips attached to an embodiment of the equipment mounting panel of the invention.

In the embodiments of FIGS. 16 and 17, device door 401 comprises a device shelf 1602 that attaches to equipment mounting plate 404 with fasteners, e.g. screws, bolts, or rivets and that provides an additional equipment mounting platform that is elevated above equipment mounting plate 404. In the embodiments of FIGS. 16 and 17, some equipment 405 is mounted to device shelf 1602, thereby allowing cables 1603 with a large bend radius (e.g. fiber optical cable) to be run underneath the equipment mounted on shelf 1602 and saving space on equipment mounting plate 404. In one or more embodiments, device shelf 1602 is configured to allow mounting of standard rack-mount equipment. In the embodiments of FIGS. 16 through 19, equipment mounting plate 404 may be marked with outlined device positions 1801, wire positions 1802, wire radius markings 1803 and wire tie points 1804 to assist in installing equipment correctly and in not exceeding allowable cable bend radii. In one or more embodiments, a variety of interchangeable equipment mounting plates 404 may be custom designed for specific applications, or may be configured to provide a variety of generic equipment mounting locations. In the embodiments of FIGS. 16, 17, and 19, cable clips 1604 may be used to secure cables 1603 to equipment mounting plate 404. In the embodiment of FIG. 19, cable clips 1604 may be temporary cable clips 1901 to facilitate rapid installation and removal of equipment. In the embodiment of FIG. 19, cable clips 1604 may be permanent cable clips 1902 to which cables are secured by cable ties 1903 once the equipment has been fully installed and no more changes need to be made to the cable layout.

Figure 20:
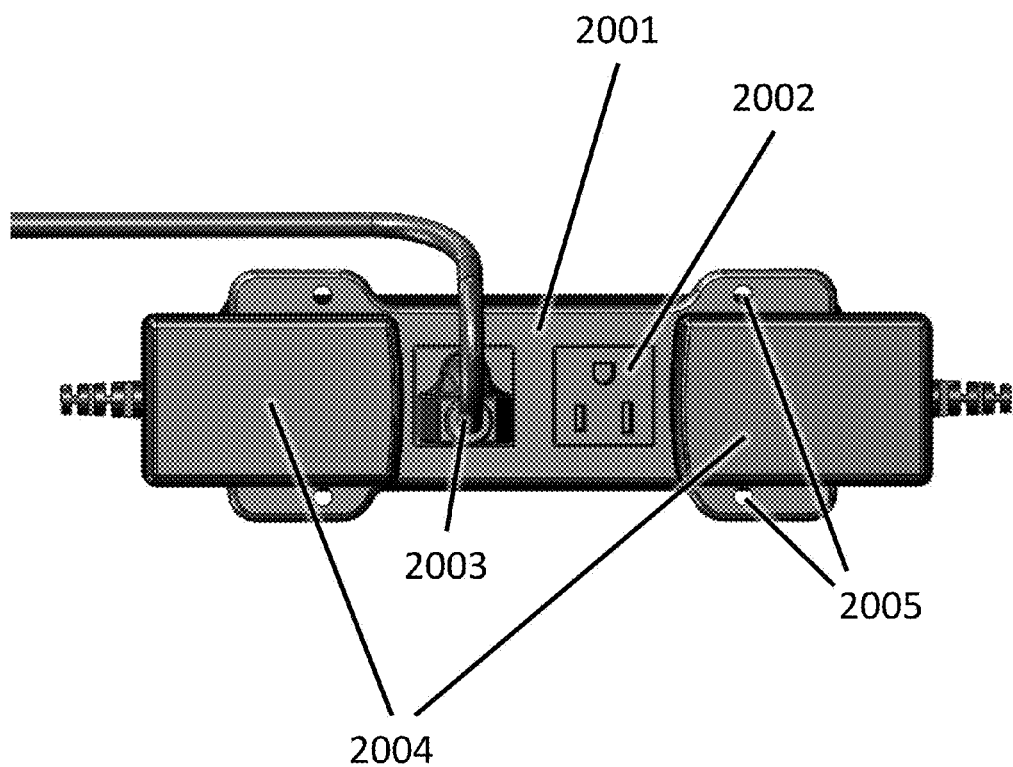
FIG. 20 is a top view of an embodiment of the power receptacle of the invention with devices plugged into it.
Figure 21:
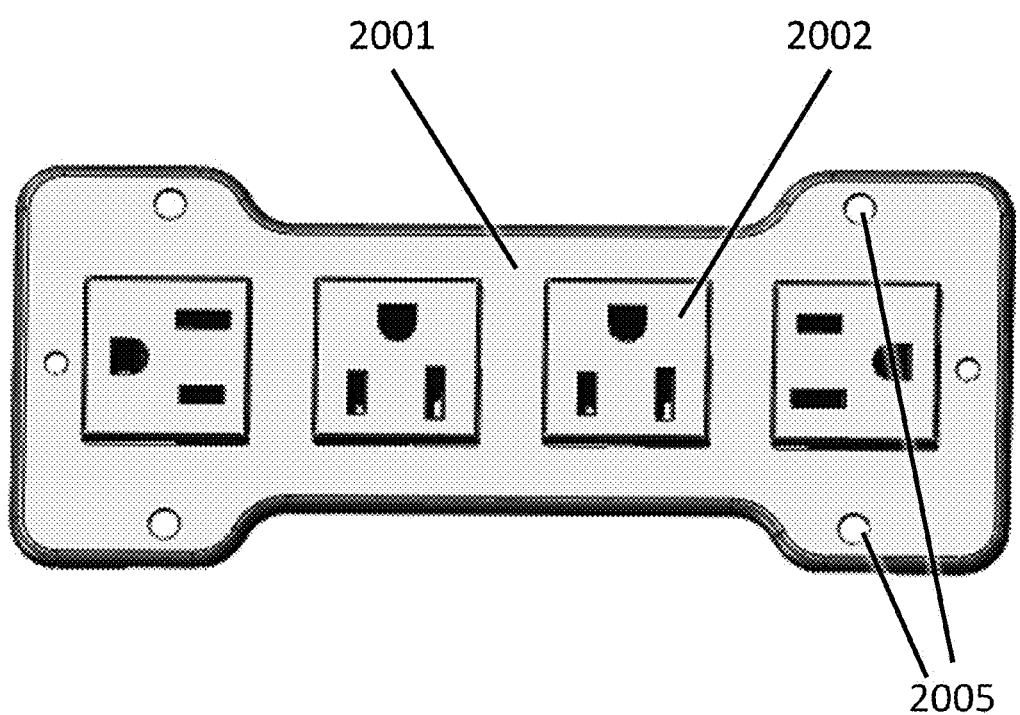
FIG. 21 is a top view of an embodiment of the power receptacle of the invention.
Figure 22:
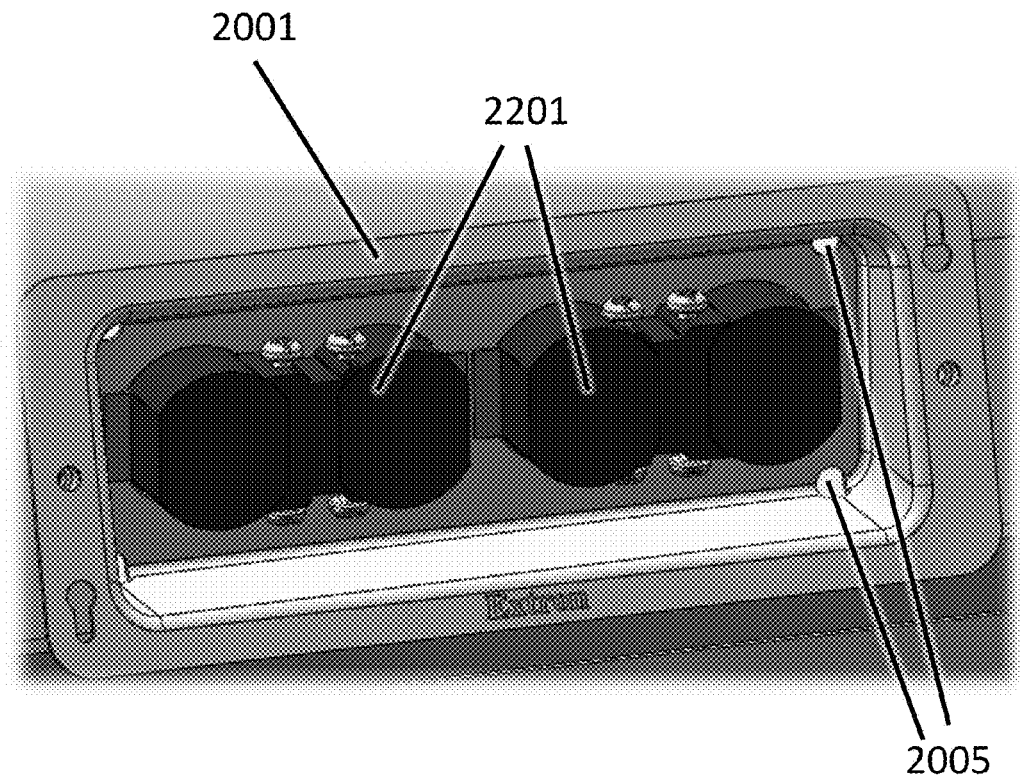
FIG. 22 is a rear perspective view of an embodiment of the power receptacle of the invention.
Figure 23:
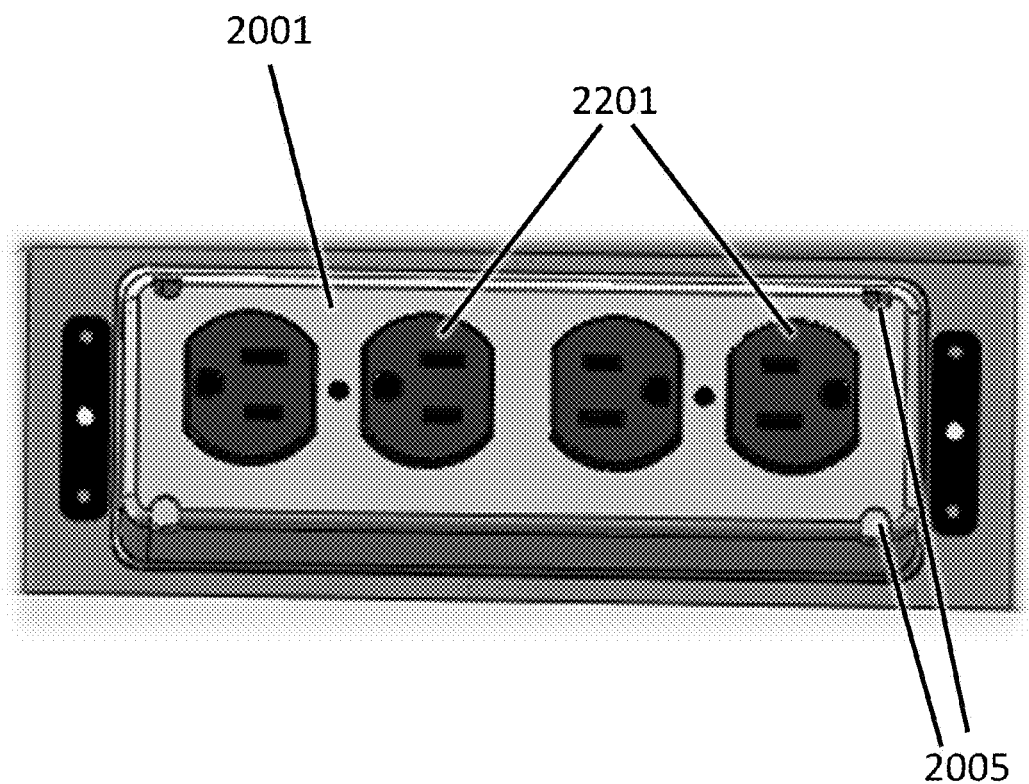
FIG. 23 is a top view of an embodiment of the power receptacle of the invention.

FIGS. 20 through 23 show the mountable power receptacle 2001 of one or more embodiments of the invention. In the embodiment of FIGS. 20 and 21, mountable power receptacle 2001 comprises one or more electrical outlets 2002. In the embodiment of FIG. 20, electrical plugs 2003 and power adapters 2004 may be plugged into electrical outlets 2002. In the embodiment of FIGS. 20 and 21 the outer electrical outlets 2002 are rotated 90 degrees relative to the inner electrical outlets so that power adapters 2004 may be plugged into the outer electrical outlets 2002 without blocking the inner ones. In the embodiment of FIGS. 22 and 23, power receptacle 2001 is configured to allow mounting of standard duplex wall outlets 2201. In the embodiment of FIGS. 20 through 23, mounting holes 2005 allow the mountable power receptacle 2001 to be attached to inner enclosure 104 (not shown). In one or more embodiments, individual electrical outlets 2002 or duplex wall outlets 2201 can be wired to separate external circuits for higher power draw.

Figure 24:
FIG. 24 is an exploded perspective view of embodiments of the power receptacle and inner enclosure of the invention.

FIG. 24 shows how the mountable power receptacle 2001 is attached to inner enclosure 104 in one or more embodiments of the invention. In the embodiment of FIG. 24, receptacle box 2401 inserts into conduit access opening 114, replacing cover plate 105, and attaches to inner enclosure 104 with threaded fasteners 120. Fasteners 120 pass through mounting holes 2402 in receptacle box 2401 and screw into threaded holes 121. Mountable power receptacle 2001 then attaches to receptacle box 2401 with fasteners (e.g. screws, bolts, or rivets), clips, or adhesive. In one or more embodiments, power receptacles 2001 are installable at any conduit access opening 114 location, allowing flexibility in the layout of equipment inside the enclosure. In one or more embodiments, additional power receptacles 2001 may be added as required at any time.

Thus one or more embodiments of a lay-in ceiling enclosure comprising a support frame, inner enclosure, back box assembly, and removable device door has been disclosed. An advantage of the disclosed invention is that it allows a division of labor that corresponds to a common division of labor in building trades. An example of such a division of labor is between a building contractor that installs a suspended ceiling, an electrician that installs building wires and conduit, and an audio/video system installer that installs equipment. Using one or more embodiments of the invention, a building contractor can place a support frame, inner enclosure, and back box assembly on the suspended ceiling framework. The contractor typically would also install support members (which may be required by applicable building and/or safety codes for seismic or other reasons) from the support frame to a support structure, such as a ceiling joist. An electrician can run external wiring and conduit to the conduit access openings of the enclosure, and can also install electrical outlets in the enclosure. In the meantime, an audio/video system installer can install equipment onto the removed device door. After the enclosure is in place in the ceiling and the external electrical wires have been attached, the audio/video system installer can mount device door with the installed equipment to the support frame, make connections between the device door equipment and the wiring inside the enclosure, and close and secure the device door to the support frame.

A further advantage of the enclosure of the invention is that it can be installed without equipment into a suspended ceiling during construction to reserve space in the ceiling. A further advantage of installing the enclosure without equipment is that damage to and/or theft of equipment during construction is prevented. A further advantage of the invention is that the support frame, inner enclosure, and back box of the invention form an enclosure that has a relatively large volume but a low profile that allows installation in ceilings that have limited vertical clearance above the ceiling tiles. A further advantage is that in one or more embodiments, the fire-resistant back box encloses the entire rear of the enclosure, sealing off the plenum space above the ceiling tiles from the equipment inside the enclosure.

Although the present invention has been described with respect to certain specific embodiments, it will be clear to those skilled in the art that the inventive features of the present invention are applicable to other embodiments as well, all of which are intended to fall within the scope of the present invention. For example, although embodiments have been described in which equipment is mounted to a door of the enclosure of the invention, equipment may alternatively, or in addition, be mounted to, in or on the inner enclosure, back box, support frame, or any other part of the enclosure of the invention. Although certain fastening methods and fasteners (e.g. screws) are disclosed for assembling various components of the invention, any other fastening methods and/or fasteners may be used (such as, for example, adhesives). Further, certain features of the invention can be used with items other than equipment. Other variations of and uses for various aspects of the present invention will be apparent to those of skill in the art.

The invention claimed is:

1. An enclosure assembly comprising:
   a device door assembly, having a first side and a second side, said device door assembly defining an angled slot, the device door assembly configured to have a ceiling tile or ceiling grille mounted on said first side;
   a removable device mounting plate, configured to have electrical equipment mounted thereon, on said second side of said device door assembly;
   a support frame comprising a hinge pin, said support frame defining an opening said opening configured to removably receive and support said device door assembly by engaging the angled slot of said device door assembly with said support frame hinge pin;
   a lock screw fastened through said removable device mounting plate, said lock screw configured to prevent said angled slot from disengaging said hinge pin;
   an enclosure having an open bottom distinct from said support frame opening,
   said enclosure assembly configured to rest upon a framework of a suspended ceiling, wherein when said enclosure assembly is resting upon the framework of the suspended ceiling and said device door assembly is swung open, said electrical equipment is accessible on the removable device mounting plate of said device door assembly below said suspended ceiling.

2. The enclosure assembly of claim 1 further comprising a back box adjacent to said enclosure.

3. The enclosure assembly of claim 2 further comprising an electrical junction box comprising a first surface accessible from an outside of said enclosure assembly and a second surface accessible from an inside of said enclosure.

4. The enclosure assembly of claim 1 wherein said lock screw is fastened through a threaded hole of said removable device mounting plate.

5. The enclosure assembly of claim 1 wherein said device door assembly is configured to pivot about a first edge of said device door assembly.

6. The enclosure assembly of claim 1 further comprising a back box that forms an air channel between said enclosure and said back box.

7. A device door assembly comprising:
   a first frame, said first frame comprising:
      a first hinge assembly comprising an angled slot, said first hinge assembly configured to be removably mountable to and supported by a support frame, wherein said angled slot is configured to engage a hinge pin of said support frame, wherein said support frame is configured to rest upon a framework of a suspended ceiling;

a removable equipment mounting plate configured to be mounted on a first side of said first frame, said removable equipment mounting plate configured to have electrical equipment mounted thereon;

a lock screw fastened through said removable equipment mounting plate, said lock screw configured to prevent said angled slot from disengaging said hinge pin, wherein said first frame is configured to receive a ceiling tile or grille.

8. The device door assembly of claim 7 wherein said first hinge assembly is configured to allow said device door assembly to pivot about a first edge of said device door assembly.

9. The device door assembly of claim 8 further comprising a first fastener for securing said device door assembly to said support frame in a closed orientation.

10. The device door assembly of claim 9 wherein said first fastener comprises a first latch assembly configured to engage a second latch assembly of said support frame.

11. The device door assembly of claim 10 wherein said first latch assembly is disposed adjacent to a second edge of said device door assembly.

12. The device door assembly of claim 7 further comprising threaded fasteners configured to secure said removable equipment mounting plate and said ceiling tile or grille.

13. The device door assembly of claim 7 comprising a floating equipment shelf configured to maintain equipment disposed apart from said removable equipment mounting plate.

* * * * *